(12) United States Patent
Yin et al.

(10) Patent No.: US 11,119,258 B2
(45) Date of Patent: Sep. 14, 2021

(54) COLOR FILTER SUBSTRATE, METHOD OF MANUFACTURING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Rui Yin, Beijing (CN); Qun Fang, Beijing (CN); Xing Su, Beijing (CN); Wenlong Mao, Beijing (CN); Wei Wu, Beijing (CN); Anxin Dong, Beijing (CN); Haibin Yin, Beijing (CN); Bin Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

(*) Notice: Subject to any disclaimer, the term of this patent is extended or adjusted under 35 U.S.C. 154(b) by 395 days.

(21) Appl. No.: 16/058,077

(22) Filed: Aug. 8, 2018

(65) Prior Publication Data
US 2019/0250314 A1    Aug. 15, 2019

(30) Foreign Application Priority Data

Feb. 11, 2018  (CN) .......................... 201810141098.0

(51) Int. Cl.
*G02B 5/22* (2006.01)
*G02B 5/20* (2006.01)
*G03F 7/00* (2006.01)

(52) U.S. Cl.
CPC ........... *G02B 5/201* (2013.01); *G03F 7/0007* (2013.01)

(58) Field of Classification Search
CPC .......... G02B 5/20; G02B 5/201; G02B 5/207; G02B 5/223; G03F 7/00; G03F 7/0007;
(Continued)

(56) References Cited

U.S. PATENT DOCUMENTS

| 5,734,456 | A  | * | 3/1998  | Takao   | ................. | G02B 5/201 |
|           |    |   |         |         |                   | 349/106    |
| 6,870,584 | B2 |   | 3/2005  | Kawase et al. |            |            |
| 9,184,418 | B2 | * | 11/2015 | Choi    | ................. | H01L 27/322 |
| 9,952,740 | B1 | * | 4/2018  | Kim     | ................. | G06F 3/04845 |
| 2003/0001992 | A1 | * | 1/2003 | Kawase | ............ | B41J 2/14233 |
|           |    |   |         |         |                   | 349/106    |

(Continued)

FOREIGN PATENT DOCUMENTS

| CN | 1395135 A | 2/2003 |
| CN | 2681168 Y | 2/2005 |

(Continued)

OTHER PUBLICATIONS

First Office Action, including Search Report, for Chinese Patent Application No. 201810141098.0, dated Jun. 24, 2020, 16 pages.

*Primary Examiner* — Stephone B Allen
*Assistant Examiner* — Jyotsna V Dabbi
(74) *Attorney, Agent, or Firm* — Westman, Champlin & Koehler, P.A.

(57) ABSTRACT

A color filter substrate, a method of manufacturing the color filter substrate and a display device. The color filter substrate includes a base substrate, and a plurality of color resists on the base substrate, the plurality of color resists having at least two different heights. Roughness of top surfaces of the plurality of color resists is inversely proportional to the heights of the plurality of color resists.

16 Claims, 3 Drawing Sheets

(58) Field of Classification Search
CPC ......... G02F 1/133512; G02F 1/133514; G02F 1/133516; G02F 1/136209; G02F 2001/136222; G02F 2001/133357; H01L 27/14621; H01L 27/14645; H01L 27/14623; H01L 27/3211; H01L 27/14647; H01L 27/14607; H01L 27/14667; H01L 27/3216; H01L 51/5284; H01L 33/22; H01L 33/50; H01L 33/504; H01L 21/0274; H01L 21/0273; H01L 21/266; H01L 21/308; H01L 21/31051; H01L 21/312; H01L 21/47573; H01L 21/7684; H01L 31/02162
USPC ........................................................ 359/891
See application file for complete search history.

(56) References Cited

U.S. PATENT DOCUMENTS

| | | |
|---|---|---|
| 2006/0234454 A1 | 10/2006 | Yasui et al. |
| 2006/0238674 A1 | 10/2006 | Sugiura et al. |
| 2010/0157212 A1* | 6/2010 | Sato .................. C09K 19/3068 349/107 |
| 2012/0132945 A1* | 5/2012 | Gmeinwieser .......... H01L 33/06 257/98 |
| 2019/0250314 A1 | 8/2019 | Yin et al. |

FOREIGN PATENT DOCUMENTS

| | | |
|---|---|---|
| CN | 1779744 A | 5/2006 |
| CN | 102709426 A | 10/2012 |
| CN | 106842687 A | 6/2017 |
| WO | 2019165641 A1 | 9/2019 |

* cited by examiner

COLOR FILTER SUBSTRATE, METHOD OF MANUFACTURING THE SAME AND DISPLAY DEVICE

CROSS-REFERENCE TO RELATED APPLICATION

This application claims the benefit of Chinese Patent Application No. 201810141098.0 filed on Feb. 11, 2018 in the State Intellectual Property Office of China, the whole disclosure of which is incorporated herein by reference.

TECHNICAL FIELD

The present disclosure relates to the field of display technologies, and in particular, to a color filter substrate, a method of manufacturing the color filter substrate, and a display device.

BACKGROUND

A color filter substrate is an important component of a display device, and a structure of the color filter substrate has an important influence on the display performance of the display device. Due to the current manufacturing process of the color filter substrate, segment differences are usually formed between a plurality of sub-pixels, resulting in unevenness of the surface of the color filter substrate, thereby affecting display performance adversely.

SUMMARY

In an aspect, it is provided a color filter substrate including: a base substrate; and a plurality of color resists on the base substrate, the plurality of color resists having at least two different heights, wherein roughness of top surfaces of the plurality of color resists is inversely proportional to the heights of the plurality of color resists.

Optionally, the plurality of color resists include a red color resist, a green color resist, and a blue color resist, and a height of the red color resist is greater than a height of the green color resist, and the height of the green color resist is greater than a height of the blue color resist.

Optionally, the color filter substrate further includes a black matrix on the base substrate and between the plurality of color resists.

Optionally, a minimum value of the heights of the plurality of color resists is greater than a height of the black matrix, and a maximum value of the roughness of the top surfaces of the plurality of color resists is less than roughness of a top surface of the black matrix.

Optionally, the height of the blue color resist is greater than a height of the black matrix, and roughness of a top surface of the blue color resist is less than roughness of a top surface of the black matrix.

Optionally, the color filter substrate further includes a planarization layer on both the plurality of color resists and the black matrix.

In another aspect, it is provided a method of manufacturing a color filter substrate, including:
providing a base substrate;
forming a plurality of color resists on the base substrate, the plurality of color resists having at least two different heights; and
performing a surface treatment to top surfaces of the plurality of color resists such that roughness of the top surfaces of the plurality of color resists is inversely proportional to heights of the plurality of color resists.

Optionally, the surface treatment includes a plasma treatment.

Optionally, the plasma treatment includes: adjusting an amount of plasma incident on the top surfaces of the plurality of color resists in such a way that the amount of the plasma incident on the top surfaces of the plurality of color resists is inversely proportional to the heights of the plurality of color resists.

Optionally, adjusting an amount of plasma incident on the top surfaces of the plurality of color resists includes: adjusting the amount of plasma incident on the top surfaces of the plurality of color resists with a mask, the mask being disposed between a plasma source generating the plasma and the base substrate and at least partially transmitting the plasma.

Optionally, the mask includes a plurality of transmissive regions in one-to-one correspondence with the plurality of color resists, plasma transmittance of the plurality of transmissive regions being inversely proportional to the heights of the plurality of color resists.

Optionally, the plurality of color resists include a red color resist, a green color resist, and a blue color resist, a height of the red color resist is greater than a height of the green color resist and the height of the green color resist is greater than a height of the blue color resist.

Optionally, the plurality of transmissive regions include a first transmissive region corresponding to the red color resist, a second transmissive region corresponding to the green color resist, and a third transmissive region corresponding to the blue color resist, the first transmissive region has a first plasma transmittance, the second transmissive region has a second plasma transmittance, and the third transmissive region has a third plasma transmittance.

Optionally, the first plasma transmittance is less than the second plasma transmittance, and the second plasma transmittance is less than the third plasma transmittance.

Optionally, the method further includes: forming a black matrix on the base substrate, a height of the black matrix being less than a minimum value of the heights of the plurality of color resists.

Optionally, the method further includes: performing the surface treatment to a top surface of the black matrix in such a way that roughness of the top surface of the black matrix is greater than maximum value of roughness of the top surfaces of the plurality of color resistors.

Optionally, the mask further includes an additional transmissive region corresponding to the black matrix, plasma transmittance of the additional transmissive region being greater than a maximum value of the plasma transmittance of the plurality of transmissive regions of the mask in one-to-one correspondence with the plurality of color resists.

Optionally, the method further includes: forming a planarization layer covering both the color resists and the black matrix, on the base substrate.

In another further aspect, it is provided a display device including the color filter substrate as stated above.

BRIEF DESCRIPTION OF THE DRAWINGS

The drawings described herein are for purposes of illustration only, and are not intended to limit the scope of the present application.

DETAILED DESCRIPTION OF PREFERRED EMBODIMENTS

Figure 1:
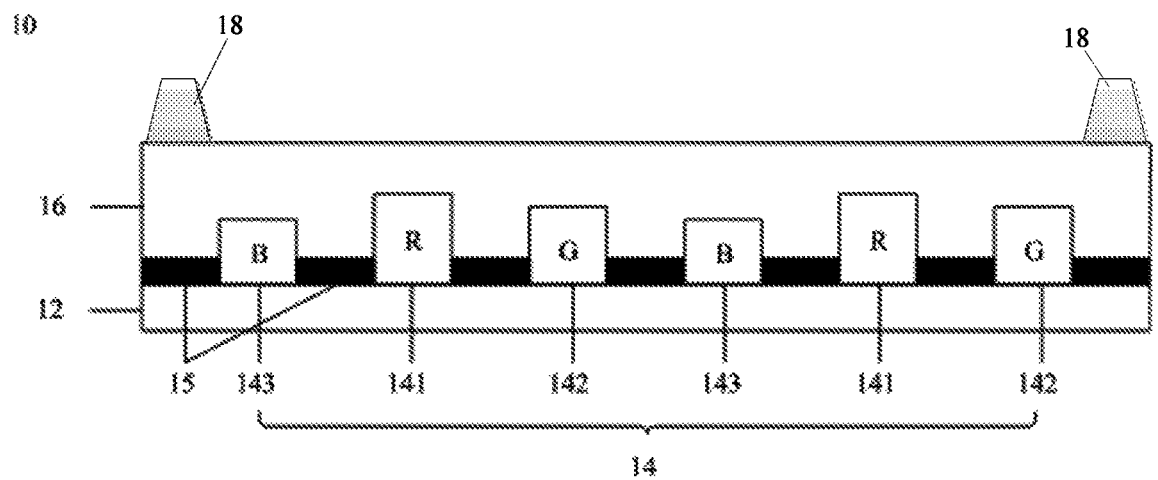
FIG. 1 shows a schematic structural view of a color filter substrate according to an embodiment of the present disclosure.

Various embodiments will be described in detail with reference to the accompanying drawings. They are provided as exemplary embodiments of the present disclosure to enable those skilled in the art to practice this disclosure.

It is to be noted that the following drawings and examples are not intended to limit the scope of the disclosure. Where a particular component of the present disclosure may be implemented in part or in whole using known components (or methods or processes), only those portions of the known components (or methods or processes) required to understand the present disclosure will be described. The detailed description of the other parts of the known components will be omitted so as not to obscure the present disclosure. Further, the various embodiments are intended to encompass equivalents that are equivalent to the components herein.

The flow chart depicted in this disclosure is merely an example. Many variations of the flow chart or the steps described therein may exist without departing from the spirit of the present disclosure. For example, the steps may be performed in a different order, or steps may be added, deleted or modified. These variations are considered to be part of the claimed aspect.

In the description of the present disclosure, the orientation or positional relationship of the terms "upper", "above", "lower", "below", "between" and the like is based on the orientation or positional relationship shown in the drawings. The terms are merely for the purpose of describing the present disclosure and the simplification of the description, and are not intended to indicate or imply that the device or element referred to must have a particular orientation, configuration and operation in a particular orientation. The terms are not to be construed as limiting the disclosure. In addition, when an element or layer is referred to as being "on" another element or layer, it may be directly on the other element or layer, or an intermediate element or layer may be present; likewise, when the element or layer is referred to as being "under" the other element or layer, it may be directly under the other element or layer, or there may be at least one intermediate element or layer; when the element or layer is referred to as being "between" two or two layers, it may be a unique element or layer between the two elements or two layers, or there may be more than one intermediate element or layer.

Unless otherwise explicitly stated in the context, the singular forms of the words used herein and the appended claims includes plural forms, and vice versa. Thus, when referring to the singular forms, the plural forms of the corresponding terms are usually included. Similarly, the terms "comprising" "including" "containing" "having" and grammatical distortions thereof are intended to be inclusive and indicate that additional elements may be present in addition to those listed. Where the term "example" is used herein, particularly when it is after a group of terms, the "example" is merely exemplary and illustrative and should not be considered to be exclusive or broad. The terms "first", "second", "third", etc. are used for the purpose of description only and are not to be construed as indicating or implying relative importance and order of formation.

A color filter substrate generally includes a plurality of color resists, for example, a red color resist, a green color resist, and a blue color resist. Each of the color resists has a desired characteristic value for chromaticity. If the color resist does not reach a desired characteristic value for chromaticity, the height of the color resist needs to be adjusted so that the color resist obtains the desired characteristic value for chromaticity. The inventors have found through a research that a surface of the color filter substrate may be uneven due to different heights of the plurality of color resists. Moreover, if height differences of the plurality of color resists are too large, a surface flatness of a planarization layer is still insufficient even if the planarization layer is formed on the color resists, resulting in dot or line defects when the display device displays an image, thereby affecting the display performance adversely.

In addition, if the flatness of the surface of the color filter substrate is insufficient, diffusion of an alignment film on the substrate may be poor in a subsequent process of applying the alignment film. Moreover, in the subsequent rubbing and aligning process, not only equipment loss, but also many defects, such as rubbing mura, horizontal black/white lines, etc., are caused.

In view of this, the present disclosure provides a color filter substrate. FIG. 1 shows a schematic structural view of a color filter substrate according to an embodiment of the present disclosure. As shown in FIG. 1, a color filter substrate 10 includes a base substrate 12, a plurality of color resists 14 and a black matrix 15 on the base substrate 12. The black matrix 15 is located between the color resists 14. The roughness of top surfaces of the color resists 14 is inversely proportional to heights of the color resists 14.

In an embodiment of the present disclosure, the color resists 14 includes a red color resist 141, a green color resist 142, and a blue color resist 143. In an exemplary embodiment, as shown in FIG. 1, a height of the red color resist 141 is greater than a height of the green color resist 142, and the height of the green color resist 142 is greater than a height of the blue color resist 143. Since the roughness of the top surfaces of the color resists 14 is inversely proportional to the heights of the color resists 14, the roughness of the top surface of the blue color resist 143 is greater than the roughness of the top surface of the green color resist 142, and the roughness of the top surface of the green color resist 142 is greater than the roughness of the top surface of the red color resist 141.

In an embodiment of the present disclosure, a minimum value of the heights of the color resists 14 is greater than a height of the black matrix 15, and a maximum value of the roughness of the top surfaces of the color resists 14 is less than the roughness of a top surface of the black matrix 15. In an exemplary embodiment, as shown in FIG. 1, in the color resists 14, the height of the blue color resist 143 is the smallest, the height of the blue color resist 143 is greater than the height of the black matrix 15, and the roughness of the top surface of the blue color resist 143 is less than the roughness of the top surface of the black matrix 15.

In an embodiment of the present disclosure, as shown in FIG. 1, the color filter substrate 10 further includes a planarization layer 16 disposed on the color resists 14 and the black matrix 15. Since during the formation of the planarization layer, the greater the roughness of the top surface is, the more easily the material of the planarization layer 16 is bonded to the top surface, and thus the greater the thickness of the formed planarization layer 16 is. Therefore, the thickness of the planarization layer 16 on the black matrix 15 is greater than the thickness of the planarization layer 16 on the blue color resist 143, and the thickness of the planarization layer 16 on the blue color resist 143 is greater than the thickness of the planarization layer 16 on the green color resist 142. The thickness of the planarization layer 16 on the green color resist 142 is greater than the thickness of the planarization layer 16 on the red color resist 141. Thus, the surface of the planarization layer 16 according to the embodiment of the present disclosure has greater flatness than a conventionally formed planarization layer.

In an embodiment of the present disclosure, as shown in FIG. 1, the color filter substrate 10 further includes spacers 18 disposed on the planarization layer 16. The spacers are used to control a distance between the color filter substrate and an array substrate in a subsequent aligning and assembling process.

It should be noted that the height of each of the color resists is not limited to the case shown in FIG. 1, and may be other cases. In addition, there is no limit to the number of color resists, and the number of color resists may be set according to actual needs.

In this way, since the roughness of the top surfaces of the color resists is inversely proportional to the heights of the color resists, the planarization layer formed on the color resists has a greater flatness, thereby improving the flatness of the surface of the color filter substrate and improving the display performance of the display device.

Figure 2:
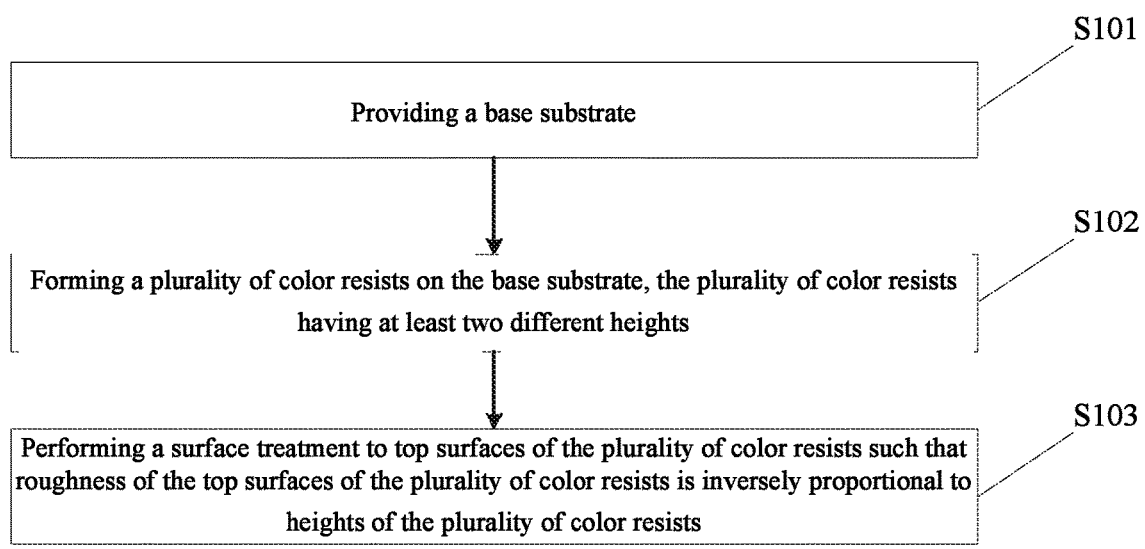
FIG. 2 shows a flow chart of a method of manufacturing a color filter substrate according to an embodiment of the present disclosure.

In another aspect of the present disclosure, a method of manufacturing a color filter substrate described herein is provided. FIG. 2 shows a flow chart of a method of manufacturing a color filter substrate in accordance with an embodiment of the present disclosure.

In step S101, a base substrate is provided.

In step S102, a plurality of color resists are formed on the base substrate, and the plurality of color resists have at least two different heights. In an exemplary embodiment, as shown in FIG. 1, the plurality of color resists may include a red color resist, a green color resist, and a blue color resist, wherein a height of the red color resist is greater than a height of the green color resist, and the height of the green color resist is greater than a height of the blue color resist.

In step S103, top surfaces of the plurality of color resists are treated so that roughness of the top surfaces of the plurality of color resists is inversely proportional to the heights of the plurality of color resists.

In an embodiment of the present disclosure, in step S103, the treatment may include a plasma treatment. The plasma may be a gas group containing positive ions, negative electrons, free radicals in excited state, neutral gas atoms and molecules, and may be generally electrically neutral. After the base substrate is plasma-treated, it is dry and can be sent to the next process without drying, thereby improving the efficiency of the entire manufacturing process. In an exemplary embodiment, the plasma treatment includes atmospheric plasma treatment using atmospheric plasma. Oxygen ions and nitrogen ions in the atmospheric plasma are highly oxidizing and can oxidize photoresists. Since the color resists and the black matrix generally include photoresists, atmospheric plasma treatment may be suitably employed.

In an embodiment of the present disclosure, the amount of plasma incident on the top surfaces of the color resists may be adjusted during plasma treatment so that the amount of plasma incident on the top surfaces of the color resists is inversely proportional to the heights of the color resists. The more the amount of plasma incident on the top surfaces of the color resists is, the more the plasma that reacts with the top surfaces of the color resists is, and thus the coarser the top surfaces of the color resists are. In an exemplary embodiment, the plurality of color resists include a red color resist, a green color resist, and a blue color resist. A height of the red color resist is greater than a height of the green color resist, and the height of the green color resist is greater than a height of the blue color resist. Accordingly, the amount of plasma incident on the top surface of the blue color resist is larger than the amount of plasma incident on the top surface of the green color resist, and the amount of plasma incident on the top surface of the green resist is larger than the amount of plasma incident on the top surface of the red resist.

Figure 3:
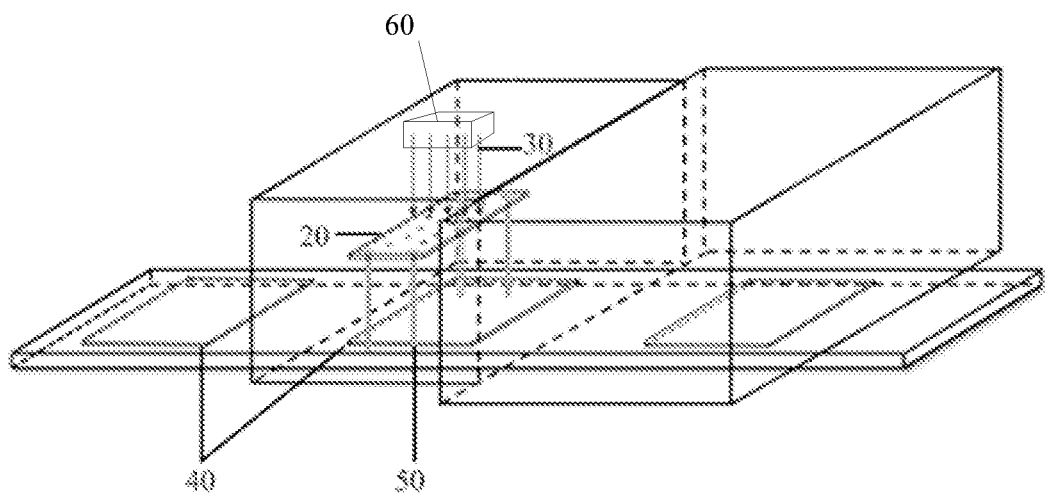
FIG. 3 shows a schematic structural view of a plasma apparatus according to an embodiment of the present disclosure.

FIG. 3 shows a schematic structural view of a plasma apparatus employed to treat a substrate in accordance with an embodiment of the present disclosure. In an embodiment of the present disclosure, as shown in FIG. 3, the amount of plasma may be adjusted by a mask 20 disposed between a plasma source 60 that generates the plasma 30 and the substrate 40. The mask 20 may at least partially transmit the plasma. Posts 50 may be disposed between the mask 20 and a carrier which carries the substrate 40 to position the mask 20. It should be understood that the manner in which the mask is set is merely illustrative, and any other manners may also be applied to the solution of the present disclosure as long as the mask may be positioned in an appropriate position. In an exemplary embodiment, a size of the mask 20 may be smaller than a size of the substrate 40, and a portion of the substrate 40 (for example, a quarter of the substrate 40) may be plasma-treated firstly, after the portion has been plasma-treated, the remaining portion of the substrate 40 (e.g., the remaining three quarters) is treated in sequence.

Figure 4:
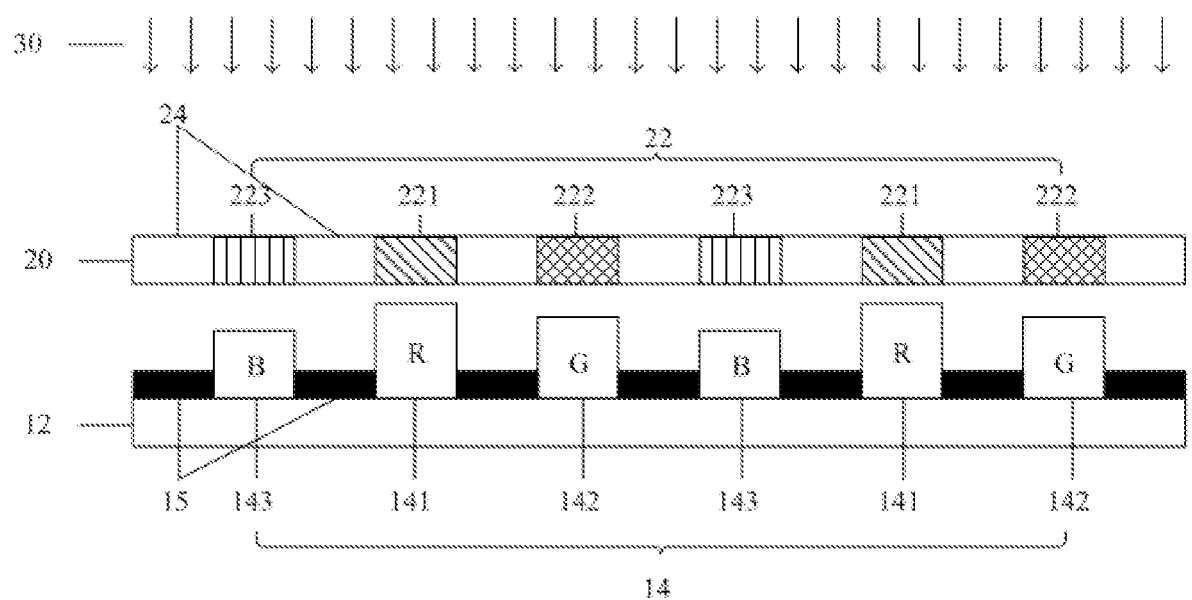
FIG. 4 shows a schematic structural view of a mask used in an embodiment of the present disclosure.

FIG. 4 shows a schematic structural view of a mask used for performing a plasma treatment on a substrate in accordance with an embodiment of the present disclosure. As shown in FIG. 4, in an embodiment of the present disclosure, the mask 20 may have a plurality of transmissive regions 22 in one-to-one correspondence with the plurality of color resists 14, and the plasma transmittance of the plurality of transmissive regions 22 is inversely proportional to the heights of the corresponding color resists. In an exemplary embodiment, the plurality of transmissive regions 22 include a first transmissive region 221, a second transmissive region 222, and a third transmissive region 223, the first transmissive region 221 corresponds to the red color resist 141, the second transmissive region 222 corresponds to the green color resist 142 and the third transmission region 223 corresponds to the blue color resist 143. The first transmission region 221 has a first plasma transmittance, the second transmission region 222 has a second plasma transmittance, and the third transmission region 223 has a third plasma transmittance. Since the height of the red color resist is greater than the height of the green color resist and the height of the green color resist is greater than the height of the blue color resist, the first plasma transmittance is less than the second plasma transmittance, and the second plasma transmittance is less than the third plasma transmittance. Thus, the amount of plasma incident on the top surface of the blue color resist is larger than the amount of plasma incident on the top surface of the green color resist, and the amount of plasma incident on the top surface of the green color resist is larger than the amount of plasma incident on the top surface of the red color resist. Therefore, the roughness of the top surface of the blue color resist is greater than the roughness of the top surface of the green color resist, and the roughness of the top surface of the green color resist is greater than the roughness of the top surface of the red color resist.

In an embodiment of the present disclosure, the step S102 may further include: forming a black matrix on the base substrate.

In an embodiment of the present disclosure, the height of the black matrix is less than a minimum value of the heights of the plurality of color resists. In an exemplary embodiment, among the plurality of color resists, the height of the blue color resist is the smallest, and the height of the black matrix is less than the height of the blue color resist.

As shown in FIG. 4, in an embodiment of the present disclosure, the mask 20 further includes an additional transmissive region 24 corresponding to the black matrix 15, the plasma transmittance of the additional transmissive region 24 is greater than a maximum value of the plasma transmission of the plurality of transmissive regions of the mask 20 corresponding to the plurality of color resists. For example, in an exemplary embodiment, in the plurality of transmissive regions of the mask 20 corresponding to the plurality of color resists, the plasma transmittance of the third transmissive region 223 of the mask 20 corresponding to the blue color resist is the greatest, and the plasma transmittance of the additional transmission region 24 is greater than the plasma transmittance of the third transmission region 223. Since the amount of plasma incident on the top surface of the black matrix is larger than the amount of plasma incident on the top surface of the blue color resist, the roughness of the top surface of the black matrix is greater than the roughness of the top surface of the blue color resist, that is, the black matrix has the largest top surface roughness. According to this embodiment, the planarization layer formed on the plurality of color resists and the black matrix has a better planarization effect.

In an embodiment of the present disclosure, the method further includes forming a planarization layer 16 covering the color resists and the black matrix on the base substrate, as shown in FIG. 1. Since the greater the roughness of the top surface on the base substrate in contact with the planarization layer is, the more easily the top surface is bonded to the material of the planarization layer when the planarization layer is formed on the substrate, the greater the thickness of the formed planarization layer is. According to an embodiment of the present disclosure, the base substrate on which the color resists and the black matrix are formed is subjected to a top surface treatment before the planarization layer is formed such that the roughness of the top surfaces of the base substrate is inversely proportional to the heights of the features (e.g., color resists, black matrix or the like), which have the top surface, of the substrate, it improves the surface flatness of the formed planarization layer.

In an embodiment of the present disclosure, the method further includes: further forming spacers 18 on the planarization layer, as shown in FIG. 1. The spacers are used to control a distance between the color filter substrate and an array substrate in a subsequent aligning and assembling process.

The method provided by this embodiment is used to manufacture the color filter substrate shown in FIG. 1 described in the foregoing embodiment, and structure, function and/or advantages of a color filter substrate manufactured by the method are the same as those of the color filter substrate in the foregoing embodiment. It will not be described in detail here.

In still another aspect of the present disclosure, a display device including the color filter substrate described in the foregoing embodiment is provided. Since the roughness of the top surfaces of the color resists of the color filter substrate is inversely proportional to the heights of the color resists, the planarization layer formed on the color resists has a larger flatness, thereby improving the flatness of the surface of the color filter substrate and improving the display performance of the display device.

The foregoing description of the embodiments has been presented for purposes of illustration and description. It is not intended to be exhaustive or to limit the application. The individual elements or features of a particular embodiment are generally not limited to the specific embodiments. However, where appropriate, these elements and features are interchangeable and may be used in the selected embodiments, even if not specifically illustrated or described. It can also be changed in many ways. Such changes are not to be regarded as a departure from the present application, and all such modifications are included within the scope of the present application.

What is claimed is:

1. A color filter substrate comprising:
   a base substrate;
   a plurality of color resists on the base substrate, the plurality of color resists having at least two different heights; and
   a black matrix on the base substrate and between the plurality of color resists,
   wherein roughness of top surfaces of the plurality of color resists is inversely proportional to the heights of the plurality of color resists, and
   wherein a minimum value of the heights of the plurality of color resists is greater than a height of the black matrix, and a maximum value of the roughness of the top surfaces of the plurality of color resists is less than roughness of a top surface of the black matrix.

2. The color filter substrate according to claim 1, wherein the plurality of color resists comprise a red color resist, a green color resist, and a blue color resist, and
   wherein a height of the red color resist is greater than a height of the green color resist, and the height of the green color resist is greater than a height of the blue color resist.

3. The color filter substrate according to claim 2, further comprising: a black matrix on the base substrate and between the plurality of color resists.

4. The color filter substrate according to claim 3, wherein the height of the blue color resist is greater than a height of the black matrix, and roughness of a top surface of the blue color resist is less than roughness of a top surface of the black matrix.

5. The color filter substrate according to claim 3, further comprising: a planarization layer on both the plurality of color resists and the black matrix.

6. A display device comprising the color filter substrate according to claim 1.

7. The color filter substrate according to claim 1, further comprising: a planarization layer on both the plurality of color resists and the black matrix.

8. A display device comprising the color filter substrate according to claim 7.

9. A method of manufacturing a color filter substrate, comprising:
providing a base substrate;
forming a plurality of color resists on the base substrate, the plurality of color resists having at least two different heights;
performing a surface treatment to top surfaces of the plurality of color resists such that roughness of the top surfaces of the plurality of color resists is inversely proportional to heights of the plurality of color resists;
forming a black matrix on the base substrate, a height of the black matrix being less than a minimum value of the heights of the plurality of color resists; and
performing the surface treatment to a top surface off the black matrix in such a way that roughness of the top surface of the black matrix is greater than maximum value of roughness of the top surfaces of the plurality of color resistors.

10. The method according claim 9, wherein the surface treatment comprises a plasma treatment.

11. The method according to claim 10, wherein the plasma treatment comprises:
adjusting an overall amount of plasma incident on the top surfaces of the plurality of color resists in such a way that the overall amount of the plasma incident on the top surfaces of the plurality of color resists is inversely proportional to the heights of the plurality of color resists.

12. The method according claim 11, wherein adjusting an overall amount of plasma incident on the top surfaces of the plurality of color resists comprises:
adjusting the overall amount of plasma incident on the top surfaces of the plurality of color resists with a mask, the mask being disposed between a plasma source generating the plasma and the base substrate and at least partially transmitting the plasma.

13. The method according to claim 12, wherein the mask comprises a plurality of transmissive regions in one-to-one correspondence with the plurality of color resists, plasma transmittance of the plurality of transmissive regions being inversely proportional to the heights of the plurality of color resists.

14. The method according to claim 13, wherein the plurality of color resists comprise a red color resist, a green color resist, and a blue color resist, a height of the red color resist is greater than a height of the green color resist and the height of the green color resist is greater than a height of the blue color resist,
wherein the plurality of transmissive regions comprise a first transmissive region corresponding to the red color resist, a second transmissive region corresponding to the green color resist, and a third transmissive region corresponding to the blue color resist, the first transmissive region has a first plasma transmittance, the second transmissive region has a second plasma transmittance, and the third transmissive region has a third plasma transmittance, and
wherein the first plasma transmittance is less than the second plasma transmittance, and the second plasma transmittance is less than the third plasma transmittance.

15. The method according to claim 9, wherein the mask further comprises an additional transmissive region corresponding to the black matrix, plasma transmittance of the additional transmissive region being greater than a maximum value of the plasma transmittance of the plurality of transmissive regions of the mask in one-to-one correspondence with the plurality of color resists.

16. The method according to claim 9, further comprising:
forming a planarization layer covering both the color resists and the black matrix, on the base substrate.

* * * * *